United States Patent [19]

Chin et al.

[11] Patent Number: 4,529,917
[45] Date of Patent: Jul. 16, 1985

[54] DRIVE CIRCUIT FOR A HORIZONTAL OUTPUT TRANSFORMER

[75] Inventors: Daniel H. Chin, Lincolnwood; Philip J. Nowaczyk, Chicago; Gregory J. Beaumont, Arlington Heights, all of Ill.

[73] Assignee: Zenith Electronics Corporation, Glenview, Ill.

[21] Appl. No.: 377,882

[22] Filed: May 13, 1982

[51] Int. Cl.³ ............................................. H01J 29/70
[52] U.S. Cl. .................................. 315/411; 315/408; 358/190
[58] Field of Search ...................... 315/411, 408, 399; 358/190

[56] References Cited

U.S. PATENT DOCUMENTS 3,970,779  7/1976  Takahashi ........................ 315/411
4,393,337  7/1983  Nagai et al. ...................... 315/408

Primary Examiner—Theodore M. Blum
Assistant Examiner—Gregory C. Issing

[57] ABSTRACT

Circuitry is described for driving the primary winding of a horizontal output transformer without the use of a conventional drive transformer. The horizontal output transistor is coupled to a tap on the output transformer and is switched off and on to excite the transformer. The horizontal output transistor is driven, in turn, by a driver transistor whose collector is also coupled to a tap on the output transformer such that adequate power is derived from the transformer to drive the output transistor into saturation. The driver transistor receives horizontal scan rate pulse from input circuitry which is preferably adapted to provide a path to ground for stored charges in the output transistor so that it may be rapidly turned fully off when a scan pulse terminates.

4 Claims, 5 Drawing Figures

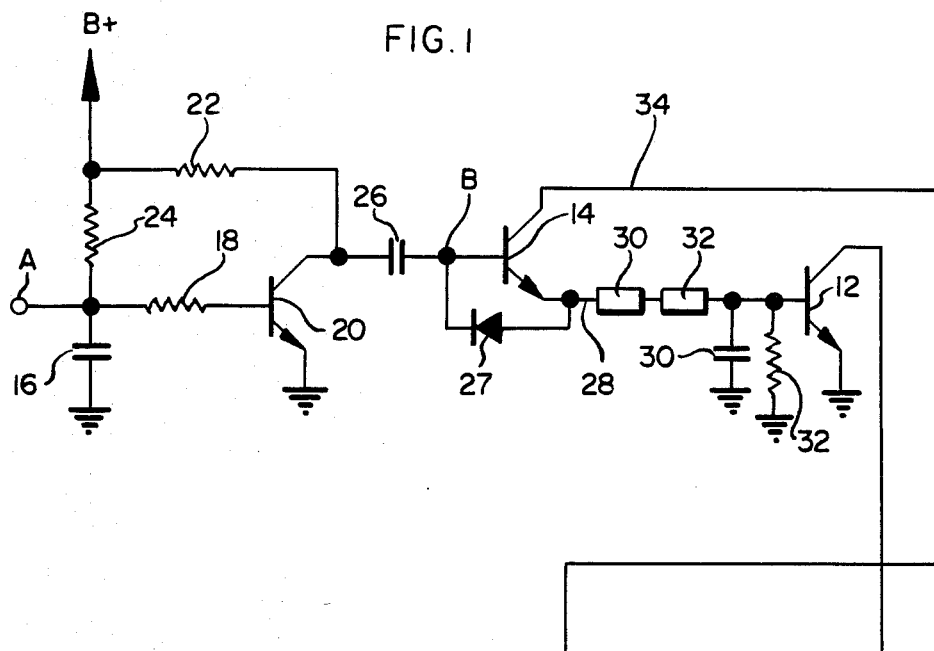
FIG. 1
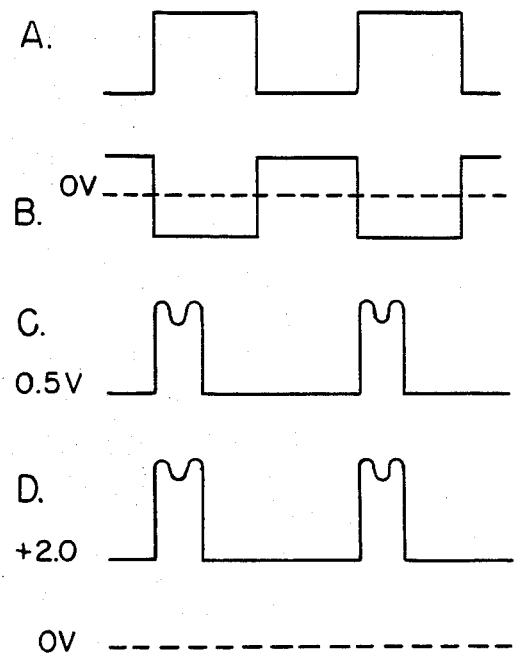
FIG. 2
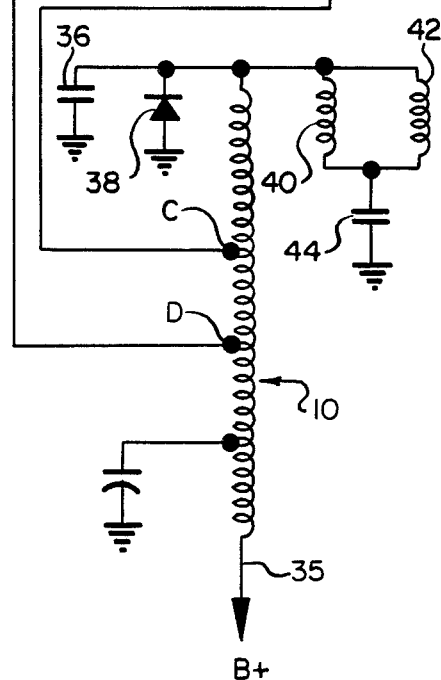

DRIVE CIRCUIT FOR A HORIZONTAL OUTPUT TRANSFORMER

BACKGROUND OF THE INVENTION

This invention is directed to improved circuitry for driving a horizontal output transformer of the type used in television receivers.

Television receivers, video monitors, and other types of display devices generally develop high voltage for a cathode ray tube by means of a horizontal output transformer. Current is switched off and on in the primary of the output transformer to develop a high voltage pulse in the transformer's secondary. That high voltage pulse is typically rectified and applied as an accelerating potential to a cathode ray tube.

To develop the switched current in the transformer's primary winding, that winding is coupled in series with a horizontal output transistor which is switched off and on at a rate equal to the horizontal scan frequency. The horizontal output transistor is, in turn, conventionally driven by horizontal rate pulses supplied by a driver transformer.

A driver transformer has been commonly used to insure that the horizontal output transistor is turned off and on properly. Although this transformer operates satisfactorily, a serious drawback resides in its relatively high cost as compared to other types of circuit components. Replacing the driver transformer with less expensive, but equally reliable circuitry, is a goal which is obviously desirable but which has not been achieved.

Accordingly, it is a general object of the invention to provide improved driving circuitry for a horizontal output transformer.

It is a more specific object of the invention to provide a transformerless driving circuit for a horizontal output transformer.

BRIEF DESCRIPTION OF THE FIGURES

The objects stated above and other objects of the invention are set forth more particularly in the following detailed description of the accompanying drawings, of which:

FIG. 1 illustrates a driver circuit for a horizontal output transformer in accordance with the invention; and FIGS. 2A-D depict various waveforms useful in describing the operation of the driver circuit.

DESCRIPTION OF THE PREFERRED EMBODIMENT

Referring to FIG. 1, a transformerless drive circuit is shown for exciting the primary winding 10 of a horizontal output transformer. The secondary of the output transformer is conventional and is omitted from the drawing. As described in more detail below, current is switched off and on in the winding 10 by a horizontal output transistor 12. This transistor, in turn, is switched off and on by a driver transistor 14 which is coupled to the horizontal output transistor 12 in a darlington configuration. To enable the driver transistor 14 to properly drive the output transistor into saturation, the collector of the driver transistor is coupled to a tap D on the primary winding. By virtue of this arrangement and other aspects of the drive circuit which are described below, the transformer which is conventionally used to drive the output transistor 12 is eliminated.

The input to the illustrated drive circuit is at a terminal A which receives horizontal scan rate pulses of the character shown in waveform A of FIG. 2. The other waveforms shown in FIG. 2 correspond to signals appearing at similarly designated points in the drive circuit.

Coupled to the terminal A is a small grounded capacitor 16 and a resistor 18 which couples the horizontal scan rate pulses to the base of an input transistor 20 whose emitter is preferably grounded. Bias for this transistor may be provided by coupling its collector to a B+ supply (12 volts, for example) via a resistor 22, and by coupling another resistor 24 between the same B+ supply and the terminal A. With this arrangement, the transistor 20 operates essentially as a driver which develops substantially rectangular pulses as its collector.

A capacitor 26 A.C. couples the collector of the transistor 20 to the base of the transistor 14 (node B). Thus, the signal at node B extends above and below zero volts as shown in waveform B of FIG. 2.

The emitter of the transistor 14 is coupled to the anode of a diode 27 whose cathode is coupled to the node B at the base of transistor 14. The function of the diode 27 is described hereinafter.

Also coupled to the emitter of the transistor 14 is a lead 28 which may carry ferrite beads 30 and 32. These beads suppress transients developed when the transistors 12 and 14 are switched off and on. The opposite end of the lead 28 is coupled to the base of the transistor 12, at which point, a capacitor 30 and a resistor 32 may couple the lead 28 to ground.

As shown, the collector of the transistor 12 is coupled to a tap C on the primary winding 10, while the collector of the transistor 14 is coupled via a lead 34 to the tap D. The tap D is located between the tap C and an end 35 of the primary winding which receives the B+ voltage. The other end of the primary winding may be coupled to a grounded damper capacitor 36, to a grounded damper diode 38, and to yoke windings 40 and 42. These yoke windings are typically mounted on the cathode ray tube of a television receiver or monitor to control the horizontal deflection of the cathode ray tube's electron beam. A capacitor 44 may couple the yoke windings 40 and 42 to ground.

In operation, a negative going transition in the input signal at terminal A causes the transistor 20 to turn off. Consequently, the signal at the collector of the transistor 20 and at node B goes high. The transistor 14 is turned on by the voltage at node B for supplying base current to the horizontal output transistor 12. As a result, the transistor 12 saturates and pulls the potential at the tap C to within about +0.5 volts of ground potential. Because the tap D is connected between the tap C and B+ supply, the potential at the tap D is not pulled to ground. Rather, as shown in waveform D of FIG. 2, the potential at the tap D is held above ground by two volts, for example, to power the driver transistor 14 sufficiently for it to drive the horizontal output transistor into saturation.

Were the collector of the transistor 14 connected directly to the collector of the transistor 12, heavy conduction by the transistor 12 could lower the voltage at the collector of the transistor 14 sufficiently to prevent it from supplying adequate base current drive to the transistor 12.

When the signal at the input terminal A goes high, the transistor 20 conducts to drive low the voltage at node B. The transistor 14, therefore, begins turning off and deprives the transistor 12 of base current. Consequently, the transistor 12 begins turning off to develop at the tab C the pulse shown in waveform C of FIG. 2.

Because of the large inductive load which the primary winding 10 presents to the transistor 12, it is necessary to drive the potential at the base of the transistor 12 negative with respect to ground to turn it fully off. This is accomplished as follows.

During turn off of the transistor 12, the charge carriers which are stored at its collector-base junction are conducted out of its base, through the lead 28, the diode 27, and the capacitor 26. Since the transistor 20 is on, those charge carriers flow to ground through the transistor 20. By this action, the potentials at the node B and at the base of the transistor 12 are driven negative with respect to ground. Thus, the transistor 12 is rapidly driven fully off. The inclusion of the capacitor 26 permits these potentials to drop below ground potential for, without it, the potential at the node B could go no lower than the saturation voltage of the transistor 20.

From the foregoing description, those skilled in the art will appreciate that the present drive circuit provides the same results as a transformer driven circuit, but without the expense of a transformer. It will also be obvious to those skilled in the art that various modifications and alterations may be made without departing from the spirit and scope of the invention. Accordingly, it is intended that all such alterations and modifications be considered as within the spirit and scope of the invention as defined by the appended claims.

What is claimed is:

1. In a display device which generates horizontal scan rate pulses for exciting the primary winding of a horizontal output transformer, a transformerless drive circuit comprising:
    a supply voltage coupled to one point on the primary winding;
    a horizontal output transistor having its collector coupled to a first tap on the primary winding for continuously establishing collector bias therefor;
    a driver transistor coupled in a darlington configuration with the horizontal output transistor, the collector of the driver transistor being coupled to the primary winding via a second tap for continuously establishing collector bias therefor, said second tap being located between the supply voltage point on the primary winding and the first tap; and
    means for coupling horizontal scan rate pulses to the base of the driver transistor,
    whereby the driver and horizontal output transistors conduct in response to each scan rate pulse such that the potential at said first tap is pulled to near ground potential while the potential at the second tap remains at a higher level to power the driver transistor sufficiently to drive the horizontal output transistor into saturation.

2. A driver circuit as set forth in claim 1 wherein said means for coupling horizontal scan rate pulses to the base of the driver transistor includes an input transistor whose base receives the horizontal scan rate pulses and whose emitter is coupled to ground, and a capacitor coupling the collector of the input transistor to the base of the driver transistor.

3. A driver circuit as set forth in claim 2 further including a diode coupled between the base of the horizontal output transistor and the base of the driver tramsistor so as to create a path to ground from the base of the horizontal output transistor via the diode, the capacitor and the input transistor and to permit the base of the horizontal output transistor to be driven below ground level in response to a scan rate pulse going low for rapidly turning off the horizontal output transistor.

4. In a television receiver which generates horizontal scan rate pulses for exciting the primary winding of a horizontal output transformer, a transformerless drive circuit comprising:
    a supply voltage coupled to one end of the primary winding;
    a horizontal output transistor having its collector coupled to a first tap on the primary winding for continuously establishing collector bias therefor;
    a driver transistor having a collector coupled to the primary winding via a second tap for continuously establishing collector bias therefor, said second tap being located between said one end of the primary winding and the first tap, and having an emitter coupled to the base of the horizontal output transistor;
    an input transistor having a base receiving the horizontal scan rate pulses;
    a capacitor coupled between the collector of the input transistor and the base of the driver transistor; and
    a diode coupled between the base of the horizontal output transistor and the base of the driver transistor.

* * * * *